US010528094B2

(12) United States Patent
Saito

(10) Patent No.: US 10,528,094 B2
(45) Date of Patent: Jan. 7, 2020

(54) ELECTRONIC DEVICE FOR LIQUID IMMERSION COOLING AND COOLING SYSTEM USING THE SAME

(71) Applicant: ExaScaler Inc., Tokyo (JP)

(72) Inventor: Motoaki Saito, Tokyo (JP)

(73) Assignee: EXASCALER INC., Tokyo (JP)

( * ) Notice: Subject to any disclaimer, the term of this patent is extended or adjusted under 35 U.S.C. 154(b) by 0 days.

(21) Appl. No.: 15/773,146

(22) PCT Filed: Nov. 16, 2015

(86) PCT No.: PCT/JP2015/082167
§ 371 (c)(1),
(2) Date: Aug. 14, 2018

(87) PCT Pub. No.: WO2017/085773
PCT Pub. Date: May 26, 2017

(65) Prior Publication Data
US 2019/0235591 A1    Aug. 1, 2019

(51) Int. Cl.
*G06F 1/20* (2006.01)
*H05K 7/20* (2006.01)
*G06F 1/18* (2006.01)

(52) U.S. Cl.
CPC ............ *G06F 1/20* (2013.01); *G06F 1/184* (2013.01); *H05K 7/20236* (2013.01); *H05K 7/20781* (2013.01); *G06F 2200/201* (2013.01)

(58) Field of Classification Search
None
See application file for complete search history.

(56) References Cited

U.S. PATENT DOCUMENTS 7,165,413 B2 * 1/2007 Symons ............... H01L 23/473
                                                    257/E23.098
10,070,558 B2 * 9/2018 Campbell ............... H05K 5/06
(Continued)

FOREIGN PATENT DOCUMENTS

JP    2009537905    10/2009
JP    2011518395     6/2011

OTHER PUBLICATIONS

Extended European Search Report dated Nov. 22, 2018 in corresponding European Patent Application No. 15908713.9 (6 pages).
(Continued)

*Primary Examiner* — Xanthia C Cunningham
(74) *Attorney, Agent, or Firm* — Procopio, Cory, Hargreaves & Savitch LLP

(57) ABSTRACT

An electronic device is immersed in a coolant filled in a cooling apparatus, and directly cooled. The electronic device is configured to be housed in each of housing parts of the cooling apparatus, and includes a metal board held with a pair of board retainers disposed in the housing part, one or more substrate groups attached to a first surface of the metal board and a second surface opposite the first surface, and a plurality of slots disposed above the one or more substrate groups, and arranged onto the metal board in parallel, each of which allows a power unit to be housed. The third circuit board is disposed so that the slots are interposed between the third circuit board and the metal board, and the network cable sockets are arranged in parallel on one side of the third circuit board, located at an opening side of the slots.

8 Claims, 12 Drawing Sheets

(56) References Cited

U.S. PATENT DOCUMENTS

| | | | |
|---|---|---|---|
| 10,070,560 B2* | 9/2018 | Campbell | H05K 7/2039 |
| 10,206,307 B2* | 2/2019 | Lau | H05K 7/2029 |
| 2007/0267741 A1 | 11/2007 | Attlesey et al. | |
| 2009/0260777 A1 | 10/2009 | Attlesey | |
| 2011/0315344 A1* | 12/2011 | Campbell | F28F 3/04 |
| | | | 165/80.4 |
| 2014/0216711 A1 | 8/2014 | Shelnutt et al. | |
| 2014/0301037 A1 | 10/2014 | Best | |
| 2015/0060009 A1* | 3/2015 | Shelnutt | F28F 27/02 |
| | | | 165/11.1 |
| 2015/0334880 A1* | 11/2015 | Best | H05K 7/20763 |
| | | | 361/679.47 |

OTHER PUBLICATIONS

Press Release, ExaScaler Inc., Mar. 31, 2015, 7 pgs.
Semiconductor, Cooling, Connection Innovated with the Aim of Exa-class High-Performance Machine (First Part), Nikkei Electronics, Nikkei Business Publications, Inc., Jun. 20, 2015, No. 1157, pp. 99-105, (Partial Translation).
Decision to Grant a Patent for JP App No. 2016-546560 dated Oct. 11, 2017, 6 pgs.
International Preliminary Report on Patentability for PCT App No. PCT/JP2015/082167 dated May 22, 2018, 7 pgs.

* cited by examiner

ELECTRONIC DEVICE FOR LIQUID IMMERSION COOLING AND COOLING SYSTEM USING THE SAME

TECHNICAL FIELD

The present invention relates to an electronic device, and a cooling system using the electronic device. More specifically, the present invention relates to an electronic device immersed in the coolant filled in a cooling apparatus so as to be directly cooled, and further relates to a cooling system using the electronic device. The electronic device described in the specification is required to exhibit super-high performance and stable operation while generating high heating value. However, it is not limited to the one as described above.

BACKGROUND ART

Power consumption is one of the essential factors to determine the performance limit of the recent supercomputer. The importance of study on saving power consumed by the supercomputer has been widely recognized. That is, the speed performance per power consumption (Flops/W) is one of indexes for evaluating the supercomputer. The power for cooling operations accounts for approximately 45% of the power consumption of the entire data center. Reduction in the power consumption by improving cooling efficiency has been increasingly demanded.

Conventionally, the process for cooling the supercomputer and the data center has been performed through two different methods, that is, air cooling method and liquid cooling method. In general, the cooling efficiency of the liquid cooling method is better than that of the air cooling method because of superior heat transfer performance to that of air. Especially, in comparison with the liquid immersion cooling system using synthetic oil, the liquid immersion cooling system using fluorocarbon-based coolant has received a lot of attention because of the advantage in regards to the maintenance work for the electronic device (specifically, for example, adjustment, inspection, repair, replacement, extension and the like).

The inventor has already developed the compact liquid immersion cooling apparatus with excellent cooling efficiency suitable for the supercomputer of small-scale liquid immersion cooling type. Such apparatus has been applied to the compact supercomputer "Suiren" installed in the high-energy accelerator research organization for operation (Non-patent Literature 1).

The inventor has also proposed the improved liquid immersion cooling apparatus configured to allow substantial improvement in packaging density of the electronic devices subjected to the liquid immersion cooling (Non-patent Literature 2).

CITATION LIST

Non-Patent Literature 1: "Liquid immersion cooling compact supercomputer "ExaScaler-1" succeeded in measurement of the value corresponding to the world highest level of the latest supercomputer power consumption performance ranking "Green500" resulting from the performance improvement by 25% or higher" Mar. 31, 2015, Press Release, ExaScaler Inc., et al., URL:http://exascaler.co.jp/wp-content/uploads/2015/03/20150331.pdf Non-Patent Literature 2: "Innovation of Semiconductor, Cooling, Connection, Aiming at Exa-grade High-performance Machine—Part I", July 2015 issue of Nikkei Electronics, pp. 99-105, Jun. 20, 2015, published by Nikkei Business Publications, Inc.

SUMMARY OF INVENTION

Technical Problem

There has been required to develop an electronic device applied to the liquid immersion cooling apparatus, which is newly configured to allow a plurality of processors to carry out arithmetic operations as prime objects so that the packaging density is further increased.

There has also been required to develop an electronic device applied to the liquid immersion cooling apparatus, which is newly configured to secure redundancy of the power unit while improving the packaging density.

There has been required to develop an electronic device applied to the liquid immersion cooling apparatus, which is newly configured to mainly operate a plurality of storage units for storage purposes so as to ensure further improvement in the packaging density.

Additionally, there has been required to develop a newly configured cooling system for directly cooling a plurality of electronic devices of different types immersed in the coolant filled in the cooling apparatus, which allows arbitrary configuration of the computer with desired calculation capacity and desired storage capacity.

Solution to Problem

According to an aspect of the present invention, the electronic device that is immersed in a coolant filled in a cooling apparatus, and directly cooled is configured to be housed in each of a plurality of housing parts of the cooling apparatus. The electronic device includes a metal board held with a pair of board retainers disposed in the housing part, and one or more substrate groups attached to a first surface of the metal board and a second surface opposite the first surface. The substrate group includes one or more first circuit boards, each including a plurality of sockets for mounting a plurality of processors and main memories on one surface of a substrate, and a component for interconnecting the processors, a second circuit board including a mother board component which includes at least a chipset for controlling the main memory, but does not include the sockets for mounting the processors and the main memories, and the component for interconnecting the processors, a connector for electrically connecting between the one or more first circuit boards and the second circuit board, and a flow channel formed in a gap between a surface opposite the one surface of the one or more first circuit boards, and one surface of the second circuit board, which faces the surface opposite the one surface of the one or more first circuit boards.

According to another aspect of the present invention, the electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, a plurality of arranged housing parts formed by dividing the open space using a plurality of internal partition walls in the cooling tank, and an inflow opening and an outflow opening for the coolant. The inflow opening is formed in a bottom part or a side surface of each of the housing parts, and the outflow opening is formed around a surface of the coolant circulating in the respective housing parts. The electronic device includes a metal board held with a pair of board retainers disposed in the housing part, and one or more substrate groups attached to a first surface of the metal board and a second surface opposite the first surface. The substrate group includes one or more first circuit boards, each including a plurality of sockets for mounting a plurality of processors and main memories on one surface of a substrate, and a component for interconnecting the processors, a second circuit board including a mother board component which includes at least a chipset for controlling the main memory, but does not include the sockets for mounting the processors and the main memories, and the component for interconnecting the processors, a connector for electrically connecting between the one or more first circuit boards and the second circuit board, and a flow channel formed in a gap between a surface opposite the one surface of the one or more first circuit boards, and one surface of the second circuit board, which faces the surface opposite the surface of the one or more first circuit boards.

In a preferred embodiment of the electronic device according to the aspect of the present invention, the electronic device further includes a plurality of spacers for holding the gap, and a plurality of screws. Each of the screws may be configured to pierce through the first circuit board, the second circuit board, and the respective spacers for fastening.

In a preferred embodiment of the electronic device according to the aspect of the present invention, the electronic device has a connected body formed by attaching the one or more substrate groups respectively to the first and the second surfaces of the metal board. Preferably, the connected body has an external shape similar to an internal shape of the housing part. For example, the connected body may have a rectangular parallelepiped external shape.

According to another aspect of the present invention, the electronic device that is immersed in a coolant filled in a cooling apparatus, and directly cooled is configured to be housed in each of a plurality of housing parts of the cooling apparatus. The electronic device includes a metal board held with a pair of board retainers disposed in the housing part, one or more substrate groups attached to a first surface of the metal board and a second surface opposite the first surface, and a plurality of slots disposed above the one or more substrate groups, and arranged onto the metal board in parallel, each of which allows a power unit to be housed. The substrate group includes a plurality of first circuit boards, each including a plurality of sockets for mounting a plurality of processors and main memories on one surface of a substrate, and a component for interconnecting the processors, a second circuit board including a mother board component which includes at least a chipset for controlling the main memory, but does not include the sockets for mounting the processors and the main memories, and the component for interconnecting the processors, a third circuit board including a plurality of network controller chips and a plurality of network cable sockets corresponding to the respective first circuit boards, a first connector for electrically connecting between the first circuit boards and the second circuit board, a second connector for electrically connecting between the second circuit board and the third circuit board, and a flow channel formed in a gap between a surface opposite the one surface of the one or more first circuit boards, and one surface of the second circuit board, which faces the surface opposite the one surface of the one or more first circuit boards. The third circuit board is disposed so that the slots are interposed between the third circuit board and the metal board, and the network cable sockets are arranged in parallel on one side of the third circuit board, located at an opening side of the slots.

According to another aspect of the present invention, the electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, a plurality of arranged housing parts formed by dividing the open space using a plurality of internal partition walls in the cooling tank, an inflow opening, and an outflow opening for the coolant. The inflow opening is formed in a bottom part or a side surface of each of the housing parts, and the outflow opening is formed around a surface of the coolant circulating in the respective housing parts. The electronic device includes a metal board held with a pair of board retainers disposed in the housing part, one or more substrate groups attached to a first surface of the metal board and a second surface opposite the first surface, and a plurality of slots disposed above the one or more substrate groups, and arranged onto the metal board in parallel, each of which allows a power unit to be housed. The substrate group includes a plurality of first circuit boards, each including a plurality of sockets for mounting a plurality of processors and main memories on one surface of a substrate, and a component for interconnecting the processors, a second circuit board including a mother board component which includes at least a chipset for controlling the main memory, but does not include the sockets for mounting the processors and the main memories, and the component for interconnecting the processors, a third circuit board including a plurality of network controller chips and a plurality of network cable sockets corresponding to the respective first circuit boards, a first connector for electrically connecting between each of the first circuit boards and the second circuit board, a second connector for electrically connecting between the second circuit board and the third circuit board, and a flow channel formed in a gap between a surface opposite the one surface of the one or more first circuit boards, and one surface of the second circuit board, which faces the surface opposite the one surface of the one or more first circuit boards. The third circuit board is disposed so that the slots are interposed between the third circuit board and the metal board, and the network cable sockets are arranged in parallel on one side of the third circuit board, located at an opening side of the slots.

In a preferred embodiment of the electronic device according to the aspect of the present invention, the electronic device further includes a plurality of spacers for holding the gap, and a plurality of screws. Each of the screws may be configured to pierce through the first circuit board, the second circuit board, and the respective spacers for fastening.

In a preferred embodiment of the electronic device according to the aspect of the present invention, the electronic device has a connected body formed by attaching the one or more substrate groups respectively to the first and the second surfaces of the metal board. Preferably, the connected body has an external shape similar to an internal shape of the housing part. For example, the connected body may have a rectangular parallelepiped external shape, for example.

According to an aspect of the present invention, the electronic device that is immersed in a coolant filled in a cooling apparatus, and directly cooled is configured to be housed in each of a plurality of housing parts of the cooling apparatus. The electronic device includes a metal board held with a pair of board retainers disposed in the housing part, a plurality of storage units attached to a first surface of the metal board and a second surface opposite the first surface, and a backplane including a plurality of connectors for electrically connecting the respective storage units, which is attached orthogonally to the first surface of the metal board, and the second surface opposite the first surface. The metal board includes a primary member and a secondary member. The primary member includes a plurality of cuts formed in a width direction for fixing a plurality of support plates that support the storage units to the primary member. The secondary member includes a plurality of pawls which are inserted into a plurality of slits formed in the backplane, and fixed to the primary member. The support plates include holes for passage of the coolant.

According to another aspect of the present invention, the electronic device that is immersed in a coolant filled in a cooling apparatus, and directly cooled is configured to be housed in each of a plurality of housing parts of the cooling apparatus. The cooling apparatus includes a cooling tank with an open space defined by a bottom wall and side walls, the arranged housing parts formed by dividing the open space using a plurality of internal partition walls in the cooling tank, an inflow opening and an outflow opening both for the coolant. The inflow opening is formed in a bottom part or a side surface of each of the housing parts, and the outflow opening is formed around a surface of the coolant circulating in the respective housing parts. The electronic device includes a metal board held with a pair of board retainers disposed in the housing part, a plurality of storage units arranged onto a first surface of the metal board and a second surface opposite the first surface, and a backplane including a plurality of connectors for electrically connecting the respective storage units, which is attached orthogonally to the first surface of the metal board, and the second surface opposite the first surface. The metal board includes a primary member and a secondary member. The primary member includes a plurality of cuts formed in a width direction for fixing a plurality of support plates that support the storage units to the primary member. The secondary member includes a plurality of pawls which are inserted into a plurality of slits formed in the backplane, and fixed to the primary member. The support plates include holes for passage of the coolant.

In a preferred embodiment of the electronic device according to the aspect of the present invention, the electronic device further includes one or more substrate groups attached to at least one of the first surface of the metal board and the second surface. Each of the one or more substrate groups may include one or more first circuit boards, each including a plurality of sockets for mounting a plurality of processors and main memories on one surface of a substrate, and a component for interconnecting the processors, a second circuit board including a mother board component which includes at least a chipset for controlling the main memory, but does not include the sockets for mounting the processors and the main memories, and the component for interconnecting the processors, a connector for electrically connecting between the one or more first circuit boards and the second circuit board, and a flow channel formed in a gap between a surface opposite the one surface of the one or more first circuit boards, and one surface of the second circuit board, which faces the surface opposite the one surface of the one or more first circuit boards.

In a preferred embodiment of the electronic device according to the aspect of the present invention, the electronic device further includes a plurality of spacers for holding the gap, and a plurality of screws. Each of the screws may be configured to pierce through the first circuit board, the second circuit board, and the respective spacers for fastening.

In a preferred embodiment of the electronic device according to the aspect of the present invention, the electronic device further includes a plurality of slots disposed above the one or more substrate groups, and arranged onto the metal board in parallel, each of which allows a power unit to be housed. Each of the one or more substrate groups further includes a third circuit board including a plurality of network controller chips and a plurality of network cable sockets corresponding to the respective first circuit boards. The third circuit board may be disposed so that the slots are interposed between the third circuit board and the metal board, and the network cable sockets are arranged in parallel on one side of the third circuit board, located at an opening side of the slots.

In a preferred embodiment of the electronic device according to the aspect of the present invention, the electronic device has a connected body formed by attaching the storage units and the backplane respectively to the metal board. Preferably, the connected body has an external shape similar to an internal shape of the housing part. For example, the connected body may have a rectangular parallelepiped external shape.

According to an aspect of the present invention, the cooling system configured to directly cool a plurality of electronic devices of different types immersed in a coolant filled in a cooling apparatus includes the cooling apparatus including a cooling tank with an open space defined by a bottom wall and side walls, a plurality of arranged housing parts formed by dividing the open space using a plurality of internal partition walls in the cooling tank, an inflow opening and an outflow opening both for the coolant. The inflow opening is formed in a bottom part or a side surface of each of the housing parts, and the outflow opening is formed around a surface of the coolant circulating in the respective housing parts, and a plurality of electronic devices of different types, including one or more first electronic devices configured to mainly execute arithmetic operations through a plurality of processors, and one or more second electronic devices configured to mainly execute storage through a plurality of storage units. One or arbitrary number of the first electronic devices and one or arbitrary number of the second electronic devices are separately housed in the housing parts of the cooling apparatus for forming a computer with a desired calculation capacity and a desired storage capacity.

In a preferred embodiment of the cooling system according to the aspect of the present invention, the first electronic device includes a metal board held with a pair of board retainers disposed in the housing part, and one or more substrate groups attached to a first surface of the metal board and a second surface opposite the first surface. The substrate group may include one or more first circuit boards, each including a plurality of sockets for mounting a plurality of processors and main memories on one surface of a substrate, and a component for interconnecting the processors, a second circuit board including a mother board component which includes at least a chipset for controlling the main memory, but does not include the sockets for mounting the processors and the main memories, and the component for interconnecting the processors, a connector for electrically connecting between the one or more first circuit boards and the second circuit boards, and a flow channel formed in a gap between a surface opposite the one surface of the one or more first circuit boards, and one surface of the second circuit board, which faces the surface opposite the one surface of the one or more first circuit boards.

In a preferred embodiment of the cooling system according to the aspect of the present invention, the first electronic device has a connected body formed by attaching the one or more substrate groups respectively to the first and the second surfaces of the metal board. Preferably, the connected body has an external shape similar to an internal shape of the housing part. For example, the connected body may have a rectangular parallelepiped external shape.

In a preferred embodiment of the cooling system according to the aspect of the present invention, the second electronic device includes a metal board held with a pair of board retainers disposed in the housing part, a plurality of storage units arranged onto the first surface of the metal board and the second surface opposite the first surface, and a backplane including a plurality of connectors for electrically connecting the respective storage units, which is attached orthogonally to the first surface of the metal board and the second surface opposite the first surface. The metal board includes a primary member and a secondary member. The primary member includes a plurality of cuts formed in a width direction for fixing a plurality of support plates that support the storage units to the primary member. The secondary member includes a plurality of pawls which are inserted into a plurality of slits formed in the backplane, and fixed to the primary member. The support plates include holes for passage of the coolant.

In a preferred embodiment of the cooling system according to the aspect of the present invention, the second electronic device has a connected body formed by attaching the storage units and the backplane respectively to the metal board. Preferably, the connected body has an external shape similar to an internal shape of the housing part. For example, the connected body may have a rectangular parallelepiped external shape.

The cooling tank having the "open space" described in the specification includes the cooling tank with a simple sealing structure sufficient to secure maintainability of the electronic device. The simple sealing structure refers to the one that allows the top plate for closing the open space of the cooling tank to be disposed on the opening of the cooling tank, or the one that allows the top plate to be detachably mounted via the packing or the like.

The above-described and other objects and advantages will be clearly understood in reference to the following explanations of the embodiments. It is to be understood that the embodiments are described for exemplifying purposes, and therefore, the present invention is not limited to those described herein.

DESCRIPTION OF EMBODIMENTS

Figure 1:
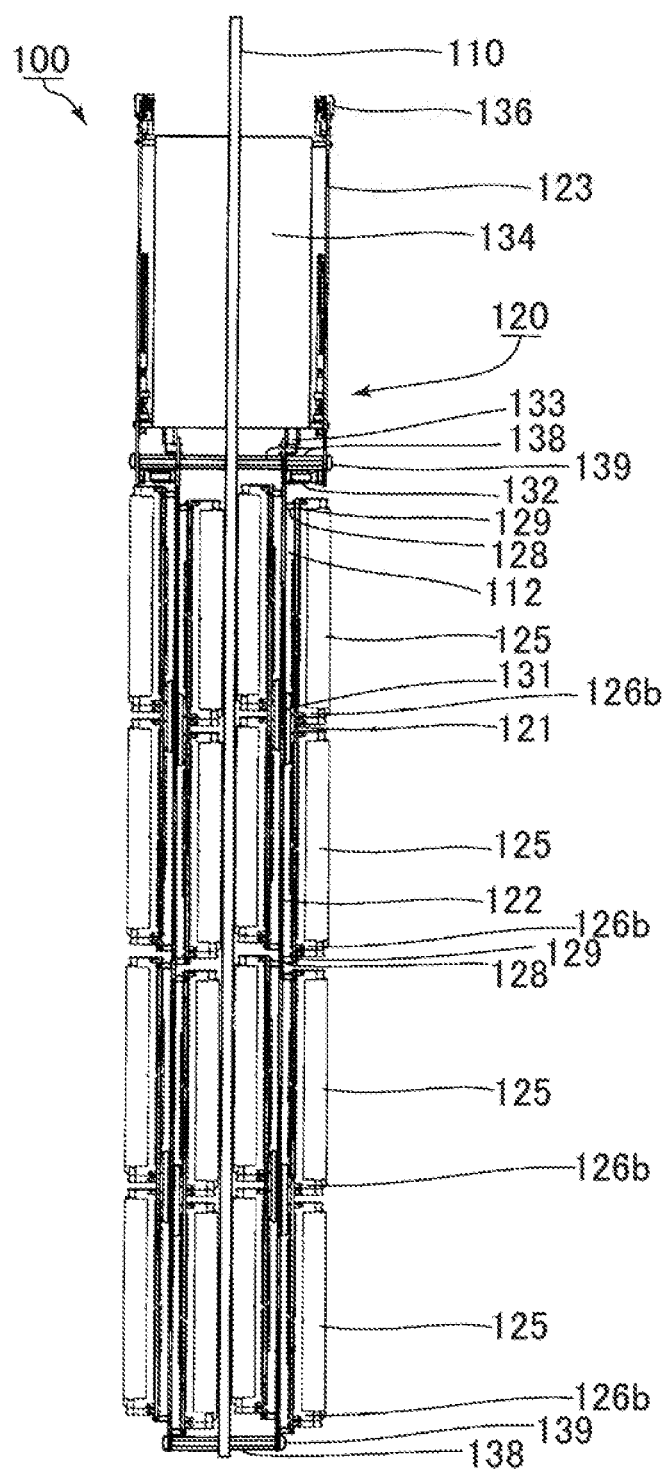
FIG. 1 is a front view of an electronic device according to an embodiment of the present invention.

Preferred embodiments of the electronic device according to the present invention will be described in detail referring to the drawings.

Figure 2:
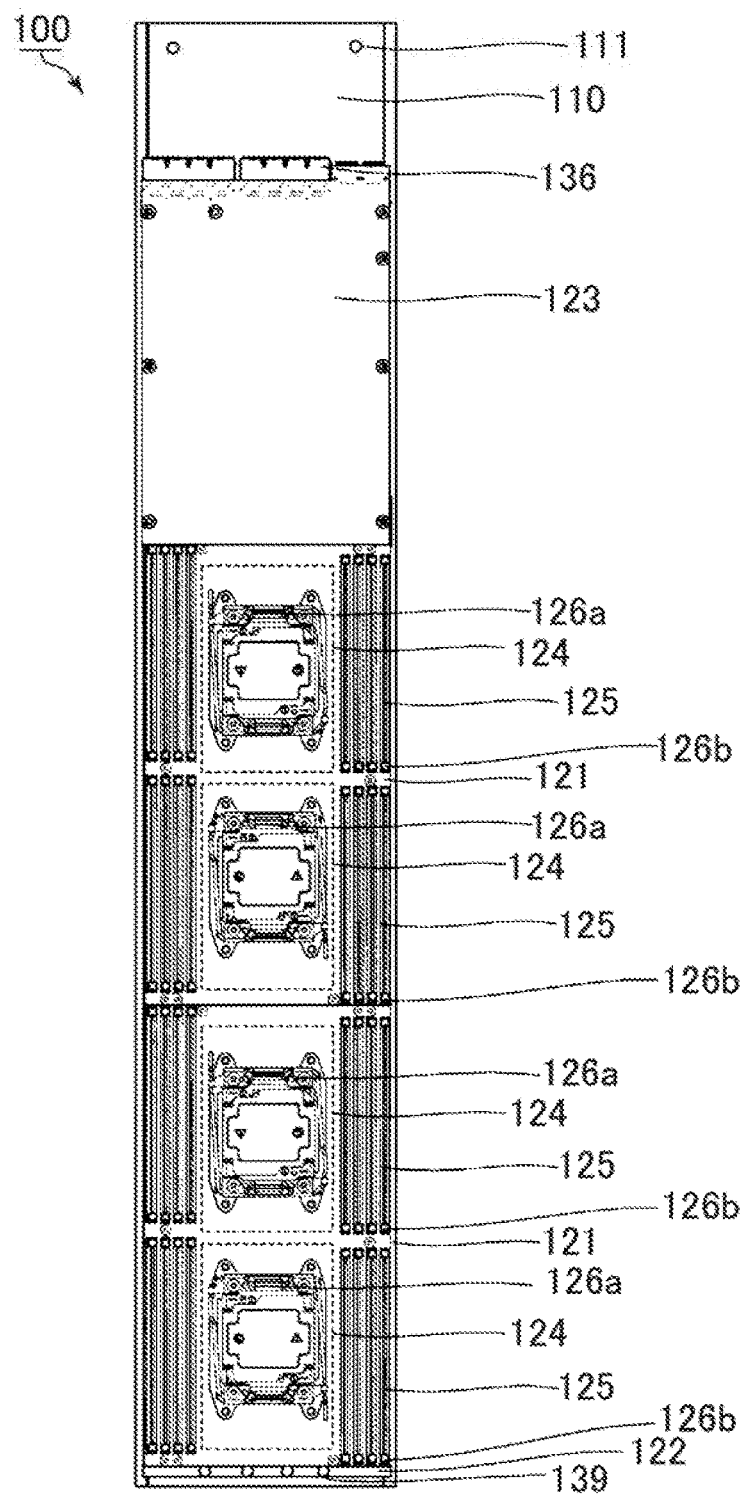
FIG. 2 is a side view of the electronic device according to the embodiment of the present invention.
Figure 3:
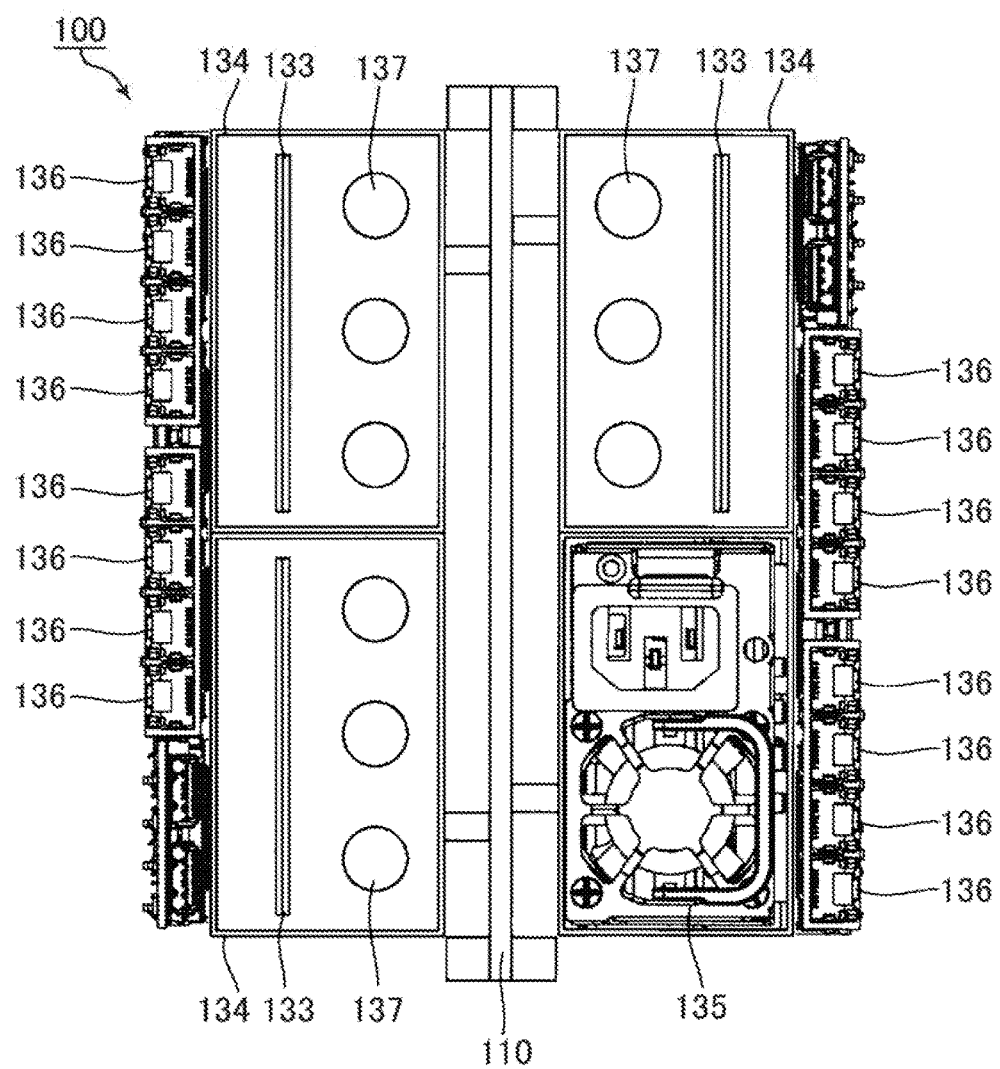
FIG. 3 is a plan view of the electronic device according to the embodiment of the present invention.

Referring to FIGS. 1 to 3, an electronic device 100 according to an embodiment of the present invention will be described. FIG. 1 is a front view of the electronic device 100 according to the embodiment of the present invention. FIG. 2 is a side view, and FIG. 3 is a plan view of the electronic device. The electronic device 100 is immersed in the coolant filled in a cooling apparatus to be described later so as to be directly cooled. It is configured to be housed in each of a plurality of housing parts of the cooling apparatus. The electronic device 100 includes a metal board 110 that is retained with a pair of board retainers to be described later, and a substrate group 120, one of which is attached to a first surface of the metal board 110, and the other is attached to a second surface opposite the first surface.

In the illustrated example, the substrate group 120 constitutes 4 first circuit boards 121. Each of the first circuit boards 121 includes a plurality of sockets 126a, 126b for mounting 2 processors 124 and 16 main memories 125 on one surface of the substrate, and a component (not shown) for interconnecting the 2 processors. Each number of the first circuit boards 121, the processors 124, and the main memories 125 is set for exemplifying purpose. Arbitrary number may be set so long as it is set as a plural. Preferably, Intel Corporation/QPI (QuickPath Interconnect) is used as the component for interconnecting the processors.

The substrate group 120 further includes second circuit boards 122 each having a mother board component (not shown). The mother board component includes at least a chipset (not shown) for controlling the main memory 125, but does not include the sockets 126a, 126b for mounting the 2 processors 124 and the 16 main memories 125, and the component (not shown) for interconnecting the processors. The mother board component may include the PCI Express bus, and the bus switch unit.

The second circuit board 122 includes a first connector 131 for electrically connecting between the first circuit board 121 and the second circuit board 122, and a flow channel 112 formed in the gap between the other surface of the first circuit substrate 121 and one surface of the second circuit board 122, which faces the other surface of the first circuit substrate. The substrate group 120 includes a plurality of spacers 128 for retaining the gap, and a plurality of screws 129. Each of the screws 129 pierces through the first circuit board 121, the second circuit board 122, and the spacers 128, respectively for fastening.

The above-structured first circuit board 121 on which the processors 124 and the main memories 125 are mounted may be detachably attached to the second circuit board 122.

It is possible to subject the first circuit boards 121 including the processors 124 and the main memories 125 to adjustment, inspection, repair, replacement, extension and the like separately from the second circuit board 122 including the mother board component, resulting in significantly improved maintainability.

In the case that the second circuit board 122 with the mother board component includes the component for interconnecting processors, there may cause the problem of deteriorating signal quality and lowering the speed owing to communication between the first circuit board 121 and the second circuit board 122. In this embodiment, the first circuit board 121 having the component for interconnecting processors ensures to effectively avoid the above-described problem.

The flow channel 127 between the first circuit board 121 and the second circuit board 122 allows the coolant circulating through the flow channel 127 to immediately take heat from the back surface of the first circuit board 121 efficiently, on which the processors are mounted, thus improving the cooling efficiency.

In the case that the single substrate group 120 is attached to the first surface and the second surface of the metal board 110 of the electronic device 100, respectively, it is preferable to make the external shape of the connected body of the metal board 110 and the two substrate groups 120 similar to the internal shape of each of the housing parts of the cooling apparatus to be described below. Preferably, the external shape of the connected body is a rectangular parallelepiped, for example, as shown in the drawing.

Referring to the illustrated example, each of the substrate group 120 includes a third circuit board 123. The third circuit board 123 includes 4 network controller chips (not shown), and 8 network cable sockets 136, respectively corresponding to the 4 first circuit boards 121. A second connector 132 serves to electrically connect between the second circuit board 122 and the third circuit board 123.

Referring to the illustrated example, 2 slots 134 are attached to the first surface, and the second surface opposite the first surface of the metal board 110, respectively above the substrate group 120 parallel to the metal board 110. As FIG. 3 shows, each of the 4 slots 134 is configured to store the power unit 135. The third circuit board 123 is fixed to the metal board 110 using the 2 spacers 138 and the screw 139 piercing through the second circuit board 122 so that the 2 slots 134 parallel to each other are interposed between the third circuit board 123 and the metal board 110. Eight network cable sockets 136 are disposed in parallel on one side of the third circuit board 123 at the opening side of the 2 slots 134.

A socket of the third connector 133 for electrically connecting the power unit 135 and the second circuit board 122 is formed in the bottom of each slot. Three bottom holes 137 through which the coolant passes are formed in the bottom of each slot for immediately and efficiently taking heat from the power unit 135.

As described above, the metal board 110 is combined with the third circuit board 123 having 4 network controller chips (not shown) corresponding to the 4 first circuit boards 121, respectively, and 8 network cable sockets 136 arranged on the single side in parallel to one another. The combination allows arrangement of the 2 slots 134 for the power unit 135 between the third circuit board 123 and the metal board 110 at the position that cannot be interfered with the network cable sockets 136. Conventionally, as the number of the first circuit boards 121 as the CPU units becomes large, it becomes more difficult to secure the space for accommodating 2 or more power units 135 because of the increased number of the network cable sockets. The use of the above-described arrangement according to the embodiment ensures to solve the problem. That is, it is possible to impart redundancy of the power unit 135 for each of the substrate groups 120.

Figure 4:
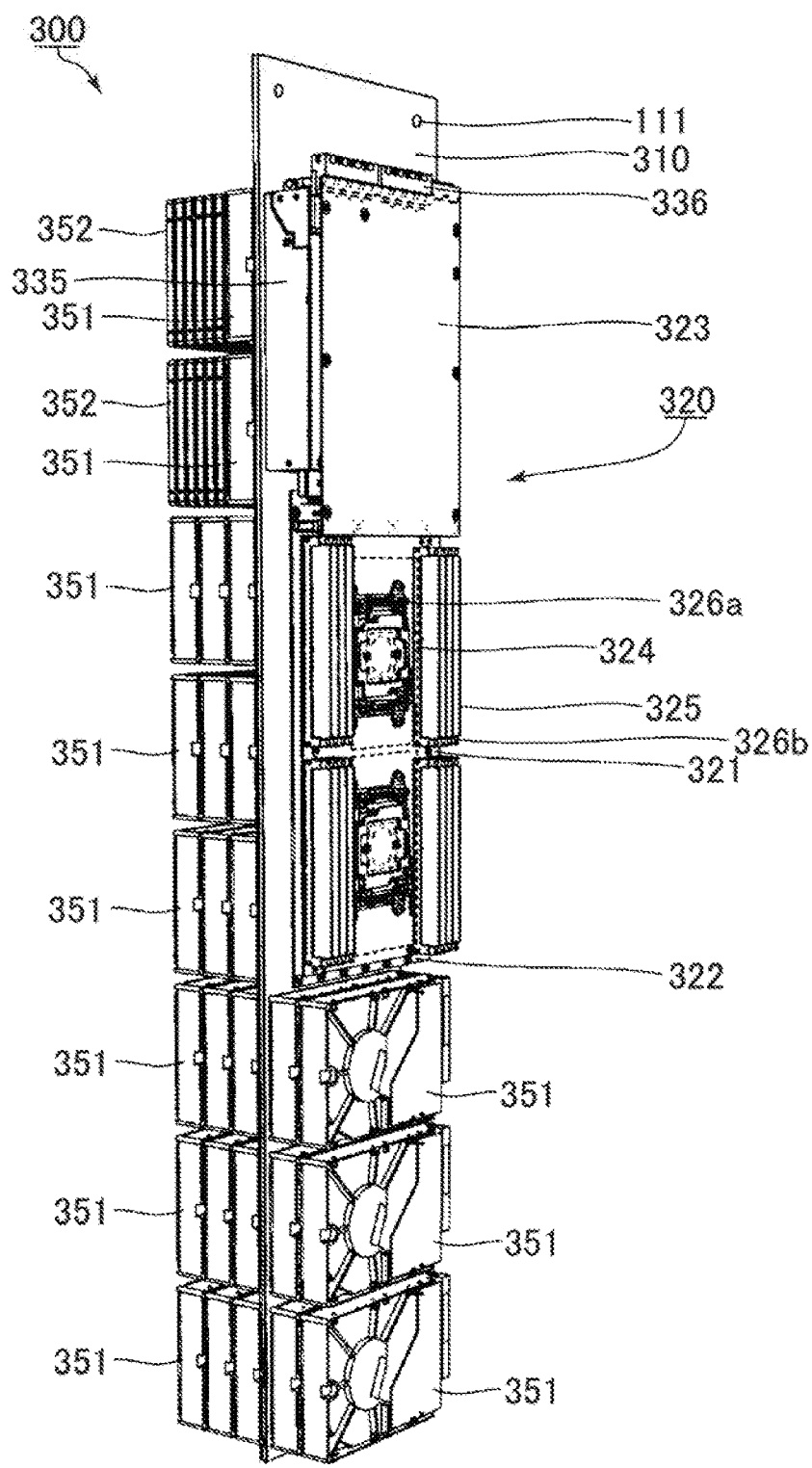
FIG. 4 is a perspective view of an electronic device according to another embodiment of the present invention.
Figure 5:
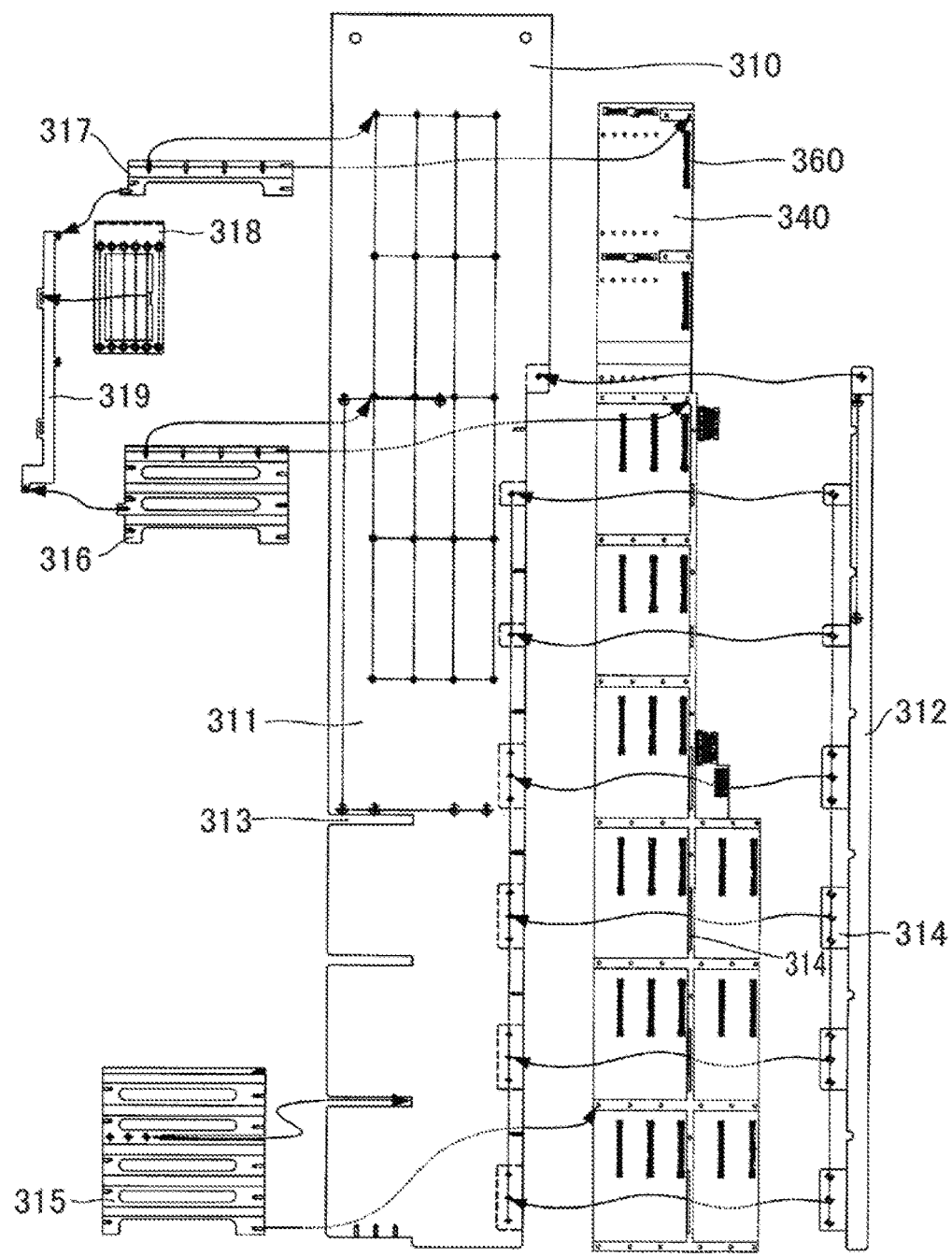
FIG. 5 is an assembly diagram showing a part of the electronic device according to another embodiment of the present invention.

An electronic device 300 according to another embodiment of the present invention will be described referring to FIGS. 4 and 5. FIG. 4 is a perspective view of the electronic device 300 according to another embodiment of the present invention, and FIG. 5 is an assembly diagram showing a part of the electronic device. The electronic device 300 is immersed in the coolant filled in a cooling apparatus to be described later so as to be directly cooled. It is configured to be housed in each of a plurality of housing parts of the cooling apparatus.

The electronic device 300 includes a metal board 310 that is retained with a pair of board retainers provided for the housing part to be described later, and a plurality of HDDs (Hard Disk Drive) 351 which are disposed on the first surface, and the second surface opposite the first surface of the metal board 310, respectively. Referring to the illustrated example, 6 HDDs 351 are disposed on the first surface, and 20 HDDs 351 are disposed on the second surface. On the second surface, 24 SSDs (Solid State Drive) 352 are disposed. Those HDDs 351 and SSDs 352 correspond to a plurality of storage units.

Likewise the electronic device 100 as shown in FIGS. 1 to 3, the electronic device 300 includes one or more substrate groups 320, each including a first circuit board 321, a second circuit board 322, and a third circuit board 323. Structures of the first circuit board 321, the second circuit board 322, and the third circuit board 323 are similar to those of the first circuit board 121, the second circuit board 122, and the third circuit board 123, respectively. Structures of the processor 324, the main memory 325, the sockets 326a, 326b, the power unit 335, and the network cable socket 336 are similar to those of the respective components of the electronic device 100, respectively. Accordingly, detailed explanations of those structures will be omitted.

In view of high-density mount of a plurality of storage units, the embodiment is characterized by the structure of the metal board 310 and the structure of the backplane 340 as shown in FIG. 5. The metal board 310 includes a plurality of storage connectors 360 for electrically connecting the respective storage units. The backplane 340 is attached at right angles with the first surface and the second surface opposite the first surface of the metal board 310.

The metal board 310 includes a primary member 311 and a secondary member 312. The primary member 311 includes a plurality of cuts 313 each formed in the width direction for fixing a plurality of support plates that support the respective storage units, that is, the HDD support plates 315 to the primary member 311. Meanwhile, the secondary member 312 includes a plurality of pawls 314 which are inserted into a plurality of slits 341 formed in the backplane 340, respectively, and fixed to the primary member 311. Among the support plates, each of the HDD support plates 315, 316 includes holes for passage of the coolant. In the illustrated example, there are 4 HDD support plates 315 so that 15 (5×3) HDDs 351 may be disposed. There are 3 HDD support plates 316 so that 9 (3×3) HDDs 351 may be disposed. Furthermore, there are 2 HDD support plates 317 so that 2 (1×2) HDDs 351 may be disposed. Meanwhile, it is possible to dispose 24 (6×4) SSDs 352 by combining the SSD support plates 318, 319 with the not-shown components.

Upon attachment of the storage units (HDDs 351, SSDs 352), the backplane 340, and the substrate group 320 to the metal board 310, the external shape of the connected body of the metal board 310, the storage units, the backplane 340, and the substrate group 320 may be similar to each internal shape of the respective housing parts. The external shape of the connected body may be rectangular parallelepiped as shown in FIG. 4.

Detailed explanation will be made with respect to preferred embodiments of the liquid immersion cooling apparatus configured to immerse the electronic device 100 according to an embodiment of the above-described invention, or the electronic device 300 according to another embodiment in the coolant for direct cooling in reference to the drawings. The following explanation relates to the high density liquid immersion cooling apparatus configured to house 16 units of the electronic devices 100 in the divided housing parts of the cooling tank so as to be cooled. The above explanation is made only for illustrative purpose, and an arbitrary number of units of the electronic devices may be housed with high density in the liquid immersion cooling apparatus without limiting the structure of the electronic device to which the present invention is applied.

Referring to FIGS. 6 to 11, a liquid immersion cooling apparatus 1 according to an embodiment includes a cooling tank 10. An open space 10a is defined by a bottom wall 11 and side walls 12 of the cooling tank 10. Inner partitions 13a, 13b, 13c, 13d, 13e are laterally disposed in the cooling tank 10 so as to equally divide the open space 10a into 4 arrayed housing parts 14a, 14b, 14c, 14d. In the embodiment, 4 units of a vertically long electronic device 100 having the width approximately ¼ of the longitudinal length of the open space 10a of the cooling tank 10 are housed in each of the housing parts 14a, 14b, 14c, 14d. That is, 16 units of the electronic device may be housed with high density.

A casing 12a is provided around the outer periphery of the side walls 12 of the cooling tank 10. The space is formed between the side wall 12 at the front side of the cooling tank 10 and the casing 12a. A top plate 10b for closing the open space 10a of the cooling tank 10 may be housed in the space. Upon the maintenance work for the liquid immersion cooling apparatus 1, the top plate 10b is kept housed in the space. Upon operation of the liquid immersion cooling apparatus 1, the top plate 10b is taken out from the space to cover the opening of the cooling tank 10 so that the open space 10a is closed.

The coolant (not shown) is filled in the cooling tank 10 up to the liquid surface (not shown) sufficient to immerse the entire body of the electronic device 100. It is preferable to use a fluorine based inert liquid formed of the complete fluoride well known as "Fluorinert (trademark of 3M Japan Products Limited) FC-72" (boiling point: 56° C.), "Fluorinert FC-770" (boiling point: 95° C.), "Fluorinert FC-3283" (boiling point 128° C.), "Fluorinert FC-40" (boiling point: 155° C.), "Fluorinert FC-43" (boiling point: 174° C.), all of which are manufactured by 3M Japan Products Limited. However, the arbitrary coolant may be used in a nonrestrictive way. The use of Fluorinert FC-40 and Fluorinert FC-43 each having the boiling point higher than 150° C., which hardly evaporates is advantageous for keeping the liquid level height in the cooling tank 10 for a long period of time.

Disposed below the bottom wall 11 of the cooling tank 10 are a plurality of inflow headers 16 each having inlets 15 for the coolant at both ends, and a plurality of outflow headers 17 each having outlets 18 for the coolant at both ends. Those inflow headers 16 and the outflow headers 17 are alternately arranged in the lateral direction with respect to the bottom wall 11 of the cooling tank 10.

Each of the inner partitions 13a, 13b, 13c, 13d, 13e includes a plurality of inflow pipes 160, and a plurality of outflow pipes 170 both penetrating through the bottom wall 11 via bottom openings 150, and extending to the level around the liquid surface of the coolant, and a plurality of board retainers 130 for retaining an edge of the metal board 110 of the electronic device 100. In the embodiment, the inflow pipes 160 and the outflow pipes 170 are alternately disposed via support spacers 140 at left and right sides of the board retainers 130 each having one end fixed to the bottom wall 11. In each of the housing parts 14a, 14b, 14c, 14d, a recess part formed by a pair of board retainers 130 longitudinally facing with each other in the cooling tank 10 is designed to mechanically hold the edge of the metal board 110 of the electronic device 100 at both sides. For the mechanical holding operation, it is possible to attach a rod-like support to the edge of the metal board 110 so as to be fit with the width of the recess part formed by the board retainers 130.

Each of the inflow pipe 160 and the outflow pipe 170 has a rectangular cross section, for example. The inflow pipe 160 has a plurality of small holes as inflow openings 116 along the longitudinal direction of the inflow pipe 160. Likewise, the outflow pipe 170 has a plurality of small holes as outflow openings 117 along the longitudinal direction of the outflow pipe 170. The inflow openings 116 are formed in front and back surfaces of the inflow pipe 160. Likewise, the outflow openings 117 are formed in front and back surfaces of the outflow pipe 170.

Additionally, a plurality of small holes penetrating through the bottom wall 11 are formed in bottom parts of the housing parts 14a, 14b, 14c, 14d as additional inflow openings 116 and outflow openings 117, respectively. Another outflow opening 127 is formed in the upper portion of the side wall 12 at the back side of the cooling tank 10. The outflow opening 127 formed in the side wall 12 at the back side corresponds to the outflow opening formed in the part around the liquid surface of the coolant.

In the embodiment, the circulation of the coolant in the use of the liquid immersion cooling apparatus 1 will be briefly described. The cold coolant which has been supplied from the inlets 15 at both ends to the inflow header 16 is partially discharged from the inflow openings 116 formed in the respective bottom parts of the housing parts 14a, 14b, 14c, 14d. The remaining coolant is supplied into the inflow pipes 160 through the bottom openings 150. The coolant supplied into the inflow pipes 160 is discharged from the inflow openings 116 formed in the inflow pipes 160.

The coolant warmed by heat taken from the electronic devices 100 housed in the housing parts 14a, 14b, 14c, 14d passes through the outflow opening 127 formed in the side wall 12 at the back side of the cooling tank 10 at the height near the liquid surface, and flows out of the cooling tank 10. The warmed coolant is partially drawn into the outflow headers 17 from the outflow openings 117 formed in the bottom parts of the housing parts 14a, 14b, 14c, 14d. At the same time, the coolant passes through the outflow openings 117 formed in the outflow pipe 170, and the bottom openings 150 so as to be drawn into the outflow headers 17. The coolant drawn into the outflow headers 17 flows out of the cooling tank 10 while passing through the outlets 18.

The inflow openings 116 for the coolant are formed in the bottom parts or the side surfaces of the respective housing parts 14a, 14b, 14c, 14d, and the outflow opening 127 is formed around the liquid surface of the coolant. The above-described structure prevents stagnation of the coolant which has been warmed by the highly densely housed electronic devices 100 in the respective housing parts 14a, 14b, 14c, 14d so that the cooling efficiency is improved. The structure having the inflow pipe 160 with the inflow openings 116 and the outflow pipe 170 with the outflow openings 117 disposed at the left and right sides of each of the board retainers 130 alternately via the support spacers 140 is especially advantageous because of further enhanced effect of preventing the coolant stagnation.

Referring to the drawing, the detailed explanation will be made with respect to the lifting mechanism configured to lift and lower the vertically long electronic devices 100 which are highly densely housed in the cooling tank 10 from/into the housing parts 14a, 14b, 14c, 14d, respectively.

A lifting mechanism 20 includes an arm 22 configured to lift the electronic devices 100 from the housing parts 14a, 14b, 14c, 14d, and lower them into the housing parts 14a, 14b, 14c, 14d. The lifting mechanism 20 includes a tower 21 equipped with a guide 218 and a motive power source 213 for raising and lowering the arm 22, and a slide mechanism 23 attached to the cooling tank 10 for movably supporting the tower 21 relative to the cooling tank 10 in a horizontal plane located above the open space 10a. As the slide mechanism 23 is directly attached to the cooling tank 10, the stage does not have to be provided in the periphery of the installation surface of the cooling tank 10. The guide 218 and the motive power source 213 of the tower 21 allow the arm 22 to move up and down. This makes it possible to safely lift or lower the electronic devices housed with high density in the cooling tank without vibrating the arm forward, backward, leftward, and rightward during the lifting operation.

In the embodiment, the tower 21 includes a reducer 214 for reducing the rotating speed of a shaft of the motive power source 213 such as the servo motor, a gear 215 for converting the rotary motion of the shaft of the reducer 214 into the rotary motion of the shaft orthogonal to the shaft of the reducer 214, a pair of timing pulleys 216, and a timing belt 217. One of brackets 222 of the arm 22 is movably supported at the guide 218 disposed in the vertical direction (Z direction) via a guide roller 219. The other bracket 222 of the arm 22 is fixed to the timing belt 217 through a belt holder 220. The shaft of the gear 215 and the shaft of the timing pulley 216 are rotatably supported with bearing holders 223.

In the embodiment, the slide mechanism 23 includes a pair of longitudinal rails 24 disposed on top ends of the pair of side walls 12 positioned in the width direction of the cooling tank 10, a movable base 25 movably supported on the pair of longitudinal rails 24, and a pair of lateral rails 26 disposed on the movable base 25. The tower 21 is movably supported on the pair of lateral rails 26. Specifically, a plurality of guide rollers 251 attached to the lower part of the movable base 25 slide on the pair of longitudinal rails 24 so as to allow the longitudinal movement (Y direction) of the tower 21. The guide rollers 251 attached to a fixation base 211 at the bottom part of the tower 21 slide on the pair of lateral rails 26 to allow the lateral movement (X direction) of the tower 21.

Referring to the example shown in the drawing, a pair of supports 28 are used for placing the pair of longitudinal rails 24 on the top ends of the side walls 12 of the cooling tank 10. The support 28 is fixed to the top end of the side wall 12 so that one end of the support 28 projects rearward of the cooling tank 10 by the length substantially equal to the longitudinal length of the tower 21. The pair of longitudinal rails 24 are disposed on the thus projected pair of supports 28. Then the pair of longitudinal rails 24 have running ranges where the movable bases 25 are located at the position apart from the rear of the upper part of the open space 10a of the cooling tank 10 for allowing the electronic device 100 to be lifted from the housing part 14a that is the nearest to the side wall 12 at the back surface side of the cooling tank 10, and to be lowered into the housing part 14a. The pair of supports 28 and the pair of longitudinal rails 24 are disposed so as to be located outside the width of the top plate 10b when it is disposed to cover the opening of the cooling tank 10. The above-described structure is designed so that those supports 28 and the longitudinal rails 24 do not interfere with covering of the open space 10a by the top plate 10b.

Stoppers 27 disposed in the periphery of both ends of the pair of longitudinal rails 24 serve to restrict the range in which the tower 21 moves in the longitudinal direction (Y direction) of the cooling tank 10 in a horizontal plane located above the open space 10a. The stoppers 27 disposed in the periphery of both ends of the pair of lateral rails 26 serve to restrict the movement of the tower 21 so that the range in which the tower 21 moves in the width direction (X direction) of the cooling tank 10 does not substantially exceed at least the width of the open space 10a. This ensures to prevent the fixation base 211 or a housing 212 of the tower 21 from extending over the width of the cooling tank 10 upon movement of the tower 21 in the width direction of the cooling tank 10. Although the plurality of liquid immersion cooling apparatuses are densely arranged, the above-described structure may prevent the interference between operation ranges of the lifting mechanisms of the adjacent liquid immersion cooling apparatuses.

The operation of the above-structured lifting mechanism 20 will be described. The tower 21 is horizontally moved with a handle at the side of the tower 21, and stopped at the position where the arm 22 is located just above the metal board 110 of the electronic device 100 to be lifted. A controller (not shown) is operated to drive the motive power source 213 of the tower 21 so that the rotation of the shaft of the motive power source 213 is transferred to the timing pulley 216 via the gear 215 to lower the arm 22 to the lowermost part. In this state, tips of a pair of suspension fittings 221 attached to the lower part of the arm 22 are connected to a pair of holes formed in the top end of the metal board 110 of the electronic device 100. Then the controller (not shown) is operated to transfer the reverse rotation of the shaft of the motive power source 213 of the tower 21 to the timing pulley 216 for lifting the arm 22. The electronic device 100 which is suspended with the arm 22 by the suspension fittings 221 is then lifted while having the metal board 110 sliding in the board retainer 130. Upon raising of the arm 22 to the uppermost part, the electronic device 100 is brought into the suspended state while being completely taken out from the board retainer 130 of the housing part 14a, 14b, 14c, or 14d. In the above-described state, the tower 21 may be horizontally moved to conduct the maintenance work for the electronic device 100 as needed. After finishing the maintenance work, the controller (not shown) is operated again to lower the electronic device 100 into the housing part 14a, 14b, 14c, or 14d so as to be returned to the original position.

Meanwhile, the controller (not shown) is operated to stop the driving operation of the motive power source 213 of the tower 21 in the process of lifting or lowering the arm 22 so that the arm 22 is made stationary at the arbitrary height in the vertical direction of the tower 21. The electronic device 100 is suspended at the desired height while being held partially in the board retainer 130 of the housing part 14a, 14b, 14c, or 14d without being completely taken out therefrom. In the above-described state, it is possible to conduct the maintenance work for the electronic device 100. In the state where the electronic device 100 is suspended as well as in the stationary state at the arbitrary height in the direction vertical to the tower 21, the reducer 214 helps in preventing the downward load applied to the arm 22 from causing unintentional rotation of the shafts of the timing pulley 216 and the motive power source 213.

In the above embodiment, the use of the single cooling tank has been explained as an example. However, it is possible to employ a plurality of cooling tanks adjacently arranged in the lateral direction. In this case, at least one lifting mechanism may be shared by the adjacently disposed cooling tanks. Specifically, the at least one lifting mechanism may be configured to include the tower having the guide and the motive power source for raising and lowering the arm, the slide mechanism which is attached to the adjacent cooling tank for movably supporting the tower relative to the adjacent cooling tank in a horizontal plane located above the open space, and the stoppers for restricting movement of the tower so that the tower movement range in the width direction of the adjacent cooling tank does not substantially exceed the distance between the side walls separated farthest in the lateral direction among those for forming the open space between the adjacent cooling tanks.

In the case of the plurality of cooling tanks adjacently arranged in the lateral direction, preferably, the slide mechanism includes the pair of longitudinal rails disposed on top ends of the pair of side walls located in the width direction of the respective cooling tanks, the movable bases supported movably on the pair of longitudinal rails, and the pair of lateral rails disposed on the movable bases. Preferably, the tower is movably supported on the pair of lateral rails. The width of the movable base may be substantially the same as that of the cooling tank, or the same as the whole width of the adjacently arranged cooling tanks. If the movable base has the width substantially the same as that of the single cooling tank, the pair of lateral rails for one of the adjacent cooling tanks may be linked to the pair of lateral rails for the other cooling tank using the appropriate linkage member. This makes it possible to move the tower on one pair of lateral rails onto the other pair of lateral rails so that the single tower is shared by the adjacently arranged cooling tanks. If the movable base has the width substantially the same as the whole width of a plurality of adjacently arranged cooling tanks, the length of the pair of lateral rails may be set to the whole width of the adjacently arranged cooling tanks. Therefore, the linkage member for linking the pairs of lateral rails is not required.

In the above embodiment, the manual movement of the tower 21 in the horizontal plane has been explained as an example. It is possible to add a motive power source for running the movable base 25 on the longitudinal rail 24, and another motive power source for running the tower 21 including the fixation base 211 on the lateral rail 26 to the lifting mechanism so as to move the tower 21 by operation of the controller (not shown). It is possible to employ the electric motive power source such as servo motor for those additional motive power sources.

In the case of movement of the tower 21 in the horizontal plane by adding the electric motive power sources, it is preferable to replace the mechanical stoppers 27 as shown in the drawing for physically preventing movement of the tower 21 with the movement restriction mechanism through software. In the specification, the stopper may include both the mechanical stopper and the movement restriction mechanism through software.

The liquid immersion cooling apparatus according to the embodiment ensures to safely lift and lower the electronic device housed in the cooling tank with high density without requiring the stage in the periphery of the installation surface of the cooling tank. Additionally, dense arrangement of a plurality of liquid immersion cooling apparatuses prevents mutual interference between the movement ranges of the lifting mechanisms of adjacent liquid immersion cooling apparatuses.

Figure 6:
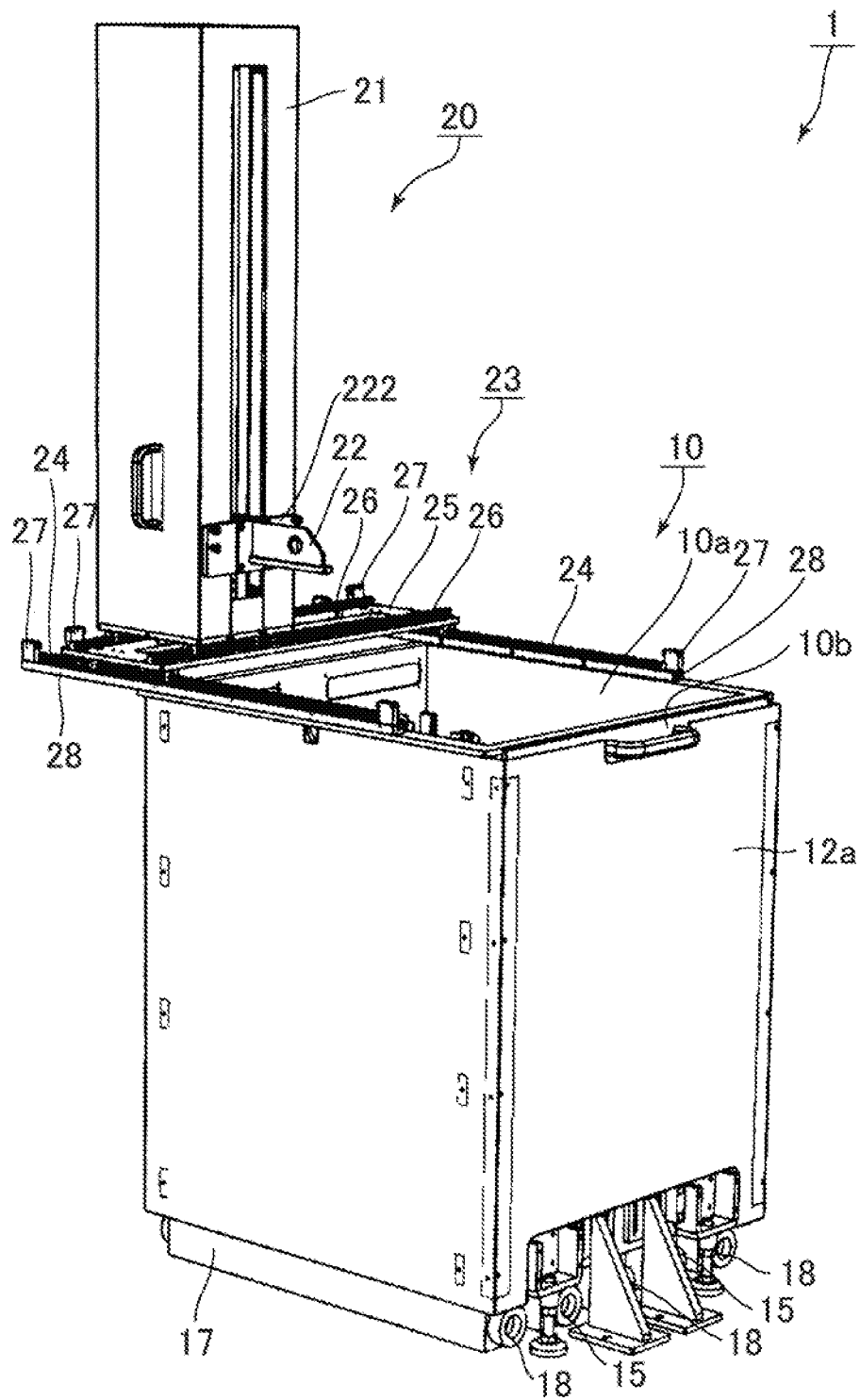
FIG. 6 is a perspective view of an overall structure of a liquid immersion cooling apparatus.
Figure 7:
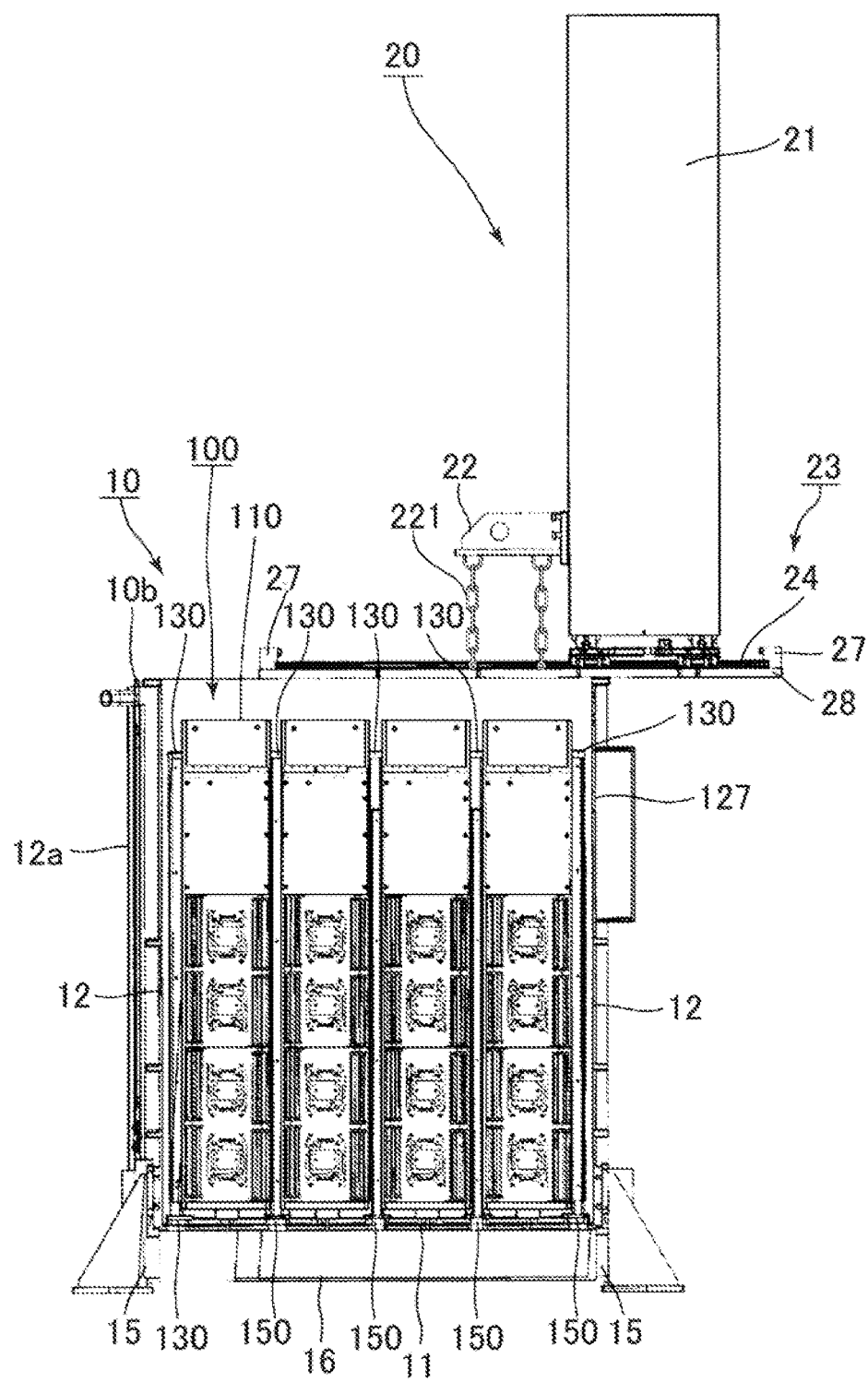
FIG. 7 is a longitudinal sectional view of the liquid immersion cooling apparatus.
Figure 8:
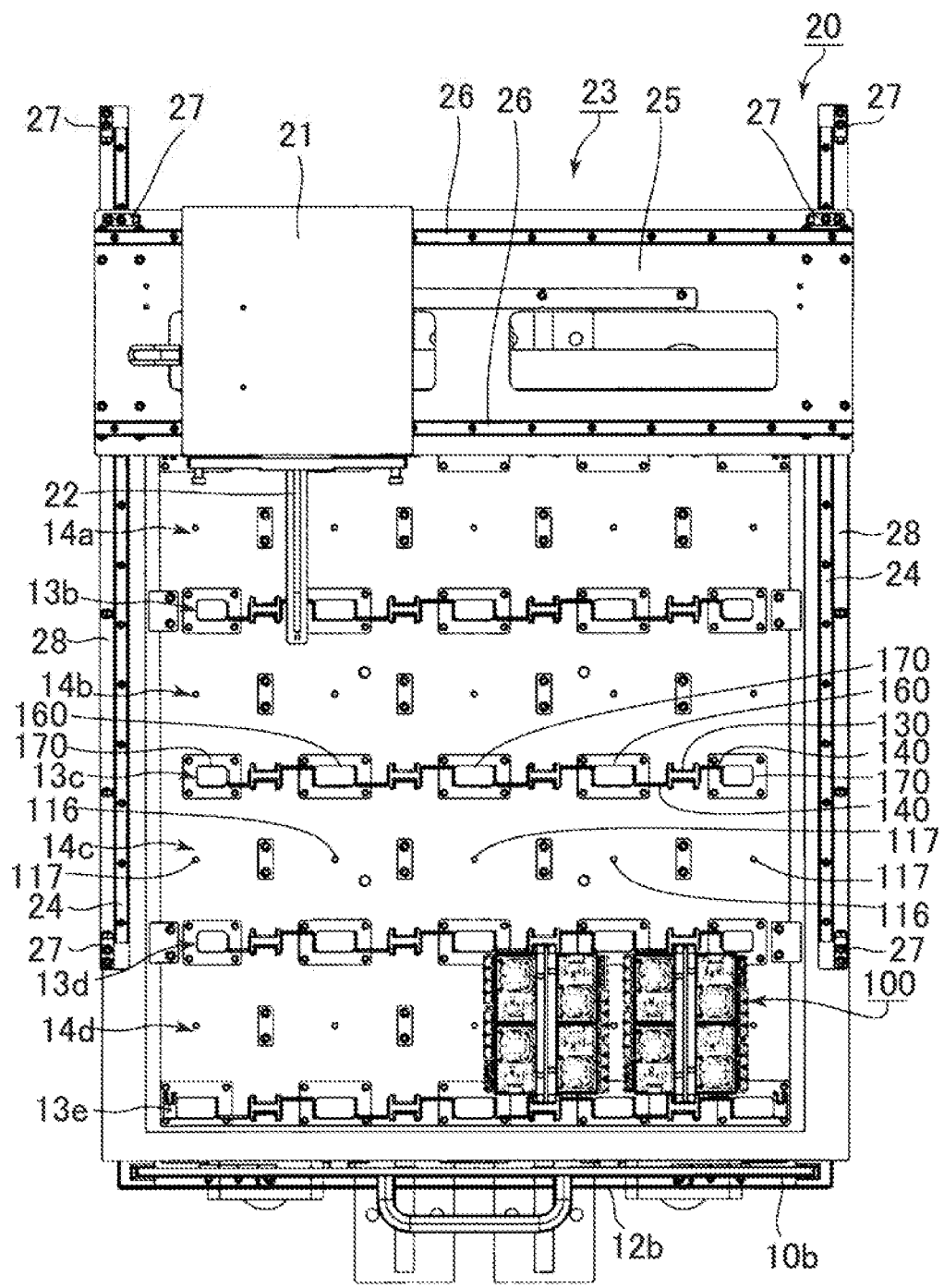
FIG. 8 is a plan view of the liquid immersion cooling apparatus.
Figure 9:
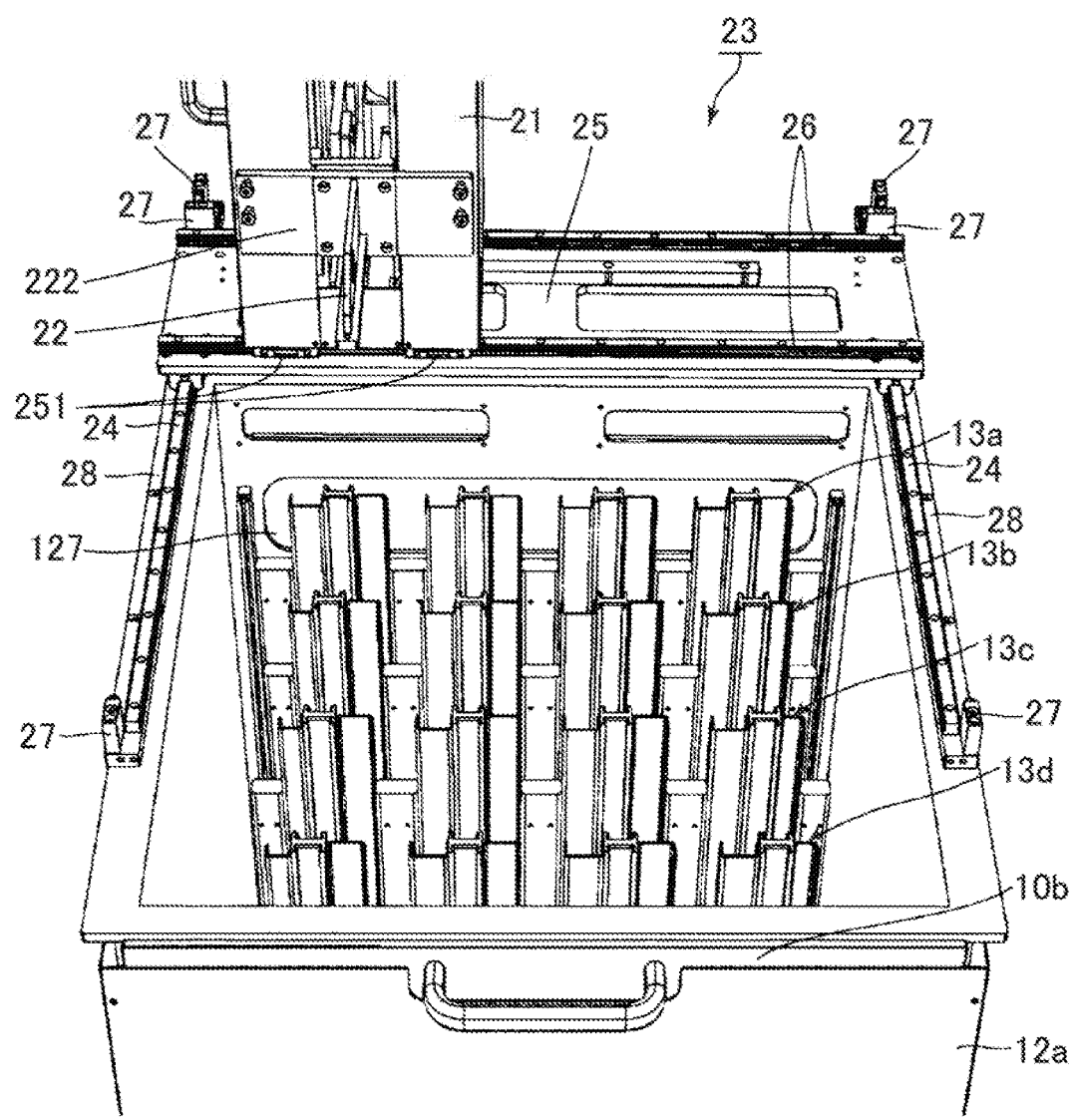
FIG. 9 is a perspective view of a structure of an essential part of the liquid immersion cooling apparatus.
Figure 10:
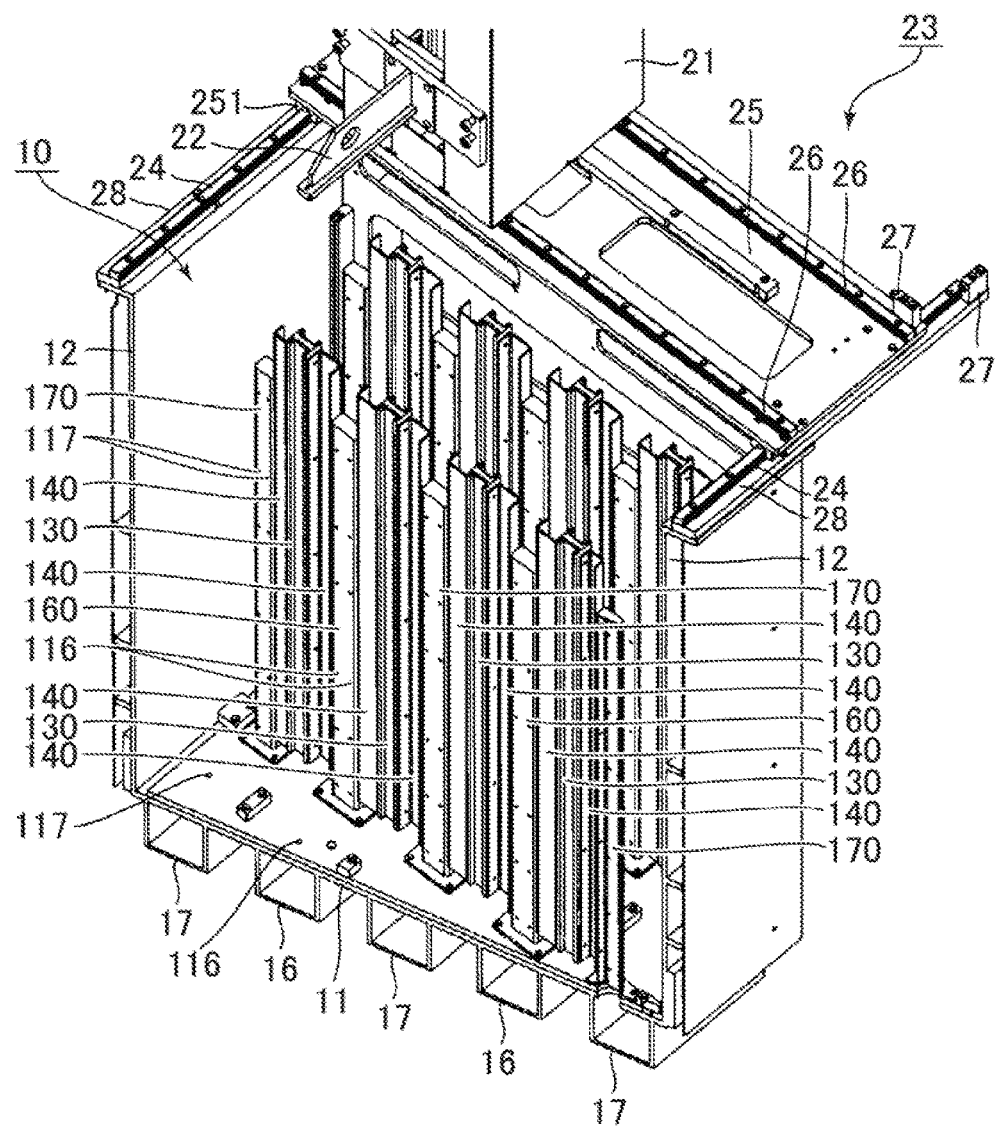
FIG. 10 is a lateral sectional view of a structure of the essential part of the liquid immersion cooling apparatus.
Figure 11:
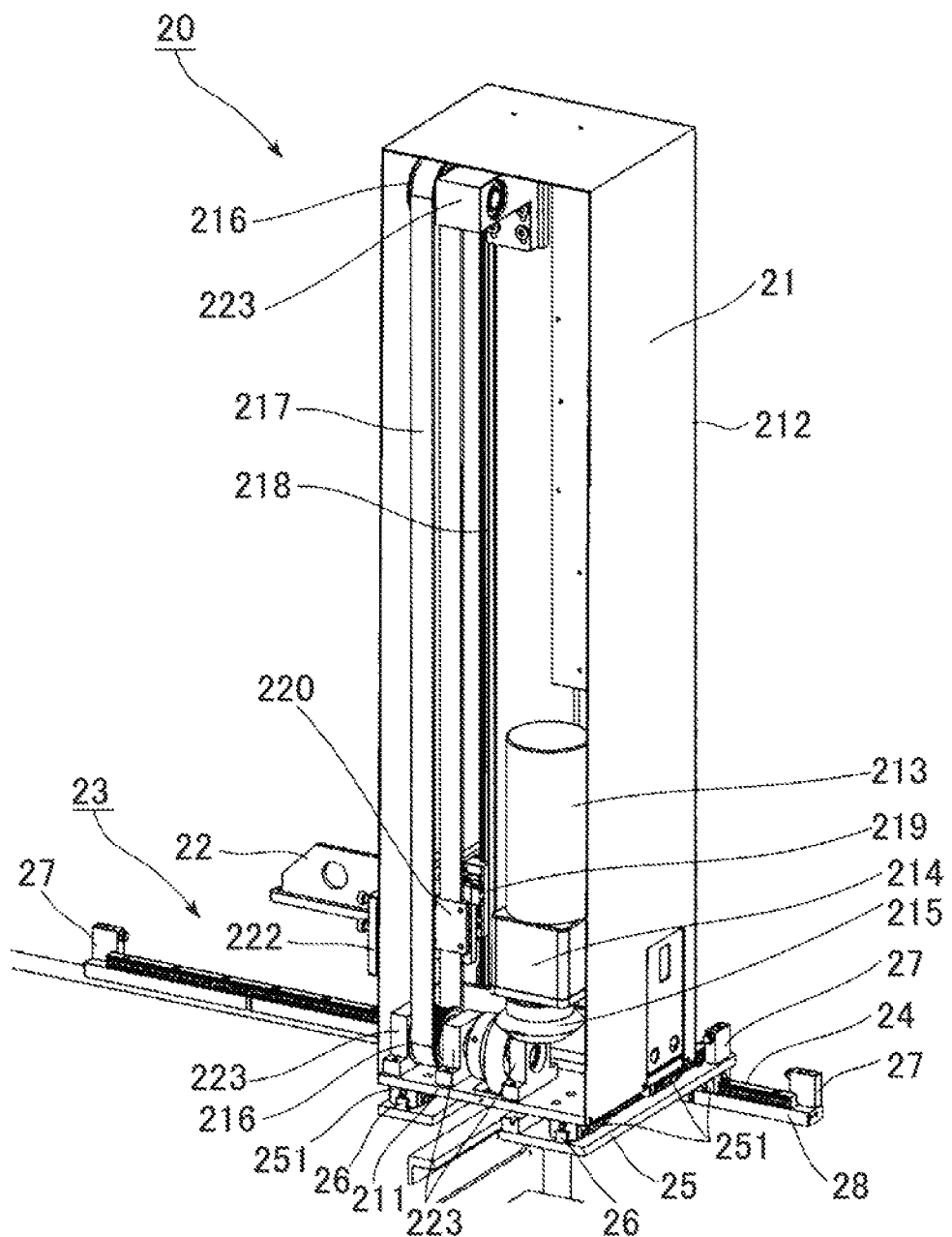
FIG. 11 is a longitudinal sectional view of an example of a lifting mechanism of the liquid immersion cooling apparatus.
Figure 12:
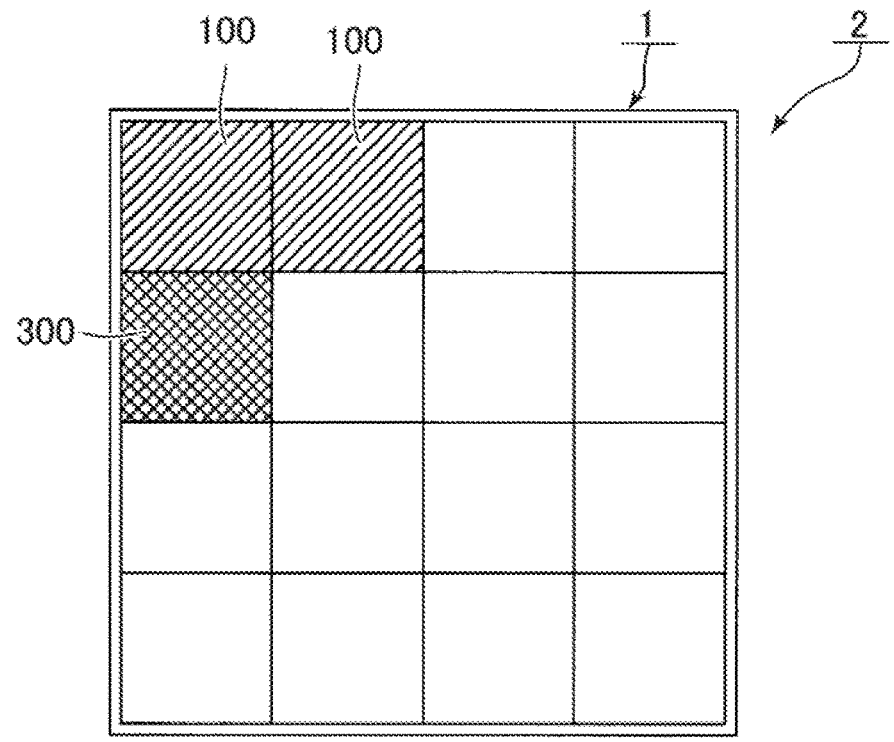
FIG. 12 is a view schematically showing a structure of a cooling system according to the present invention.
Figure 12:
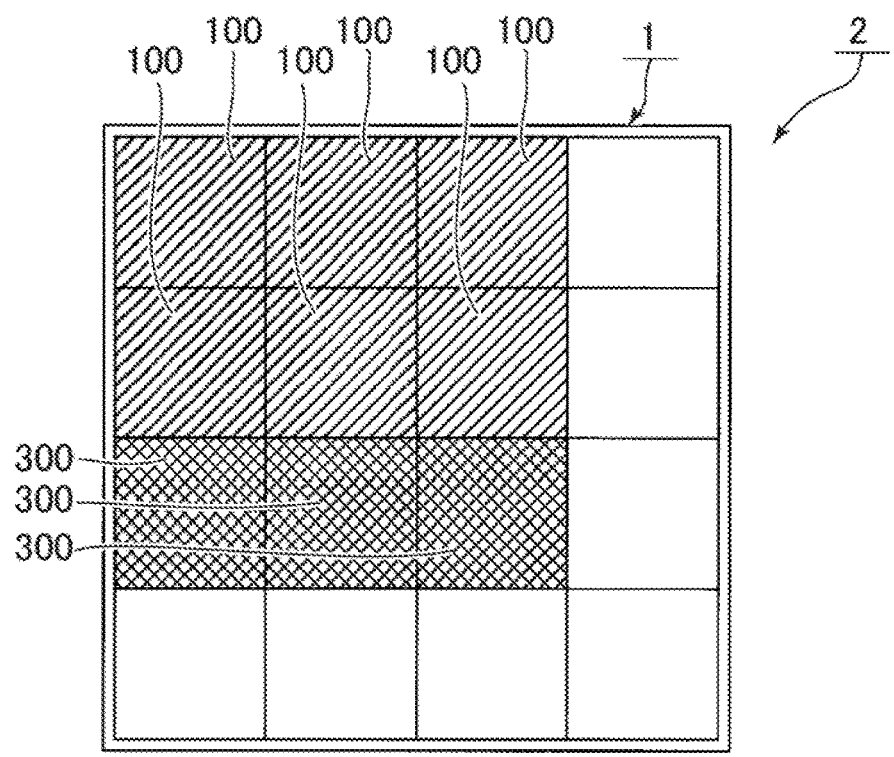

As described above, in the embodiment, it is possible to house a plurality of different kinds of electronic devices including the electronic devices 100 and 300, for example, in the plurality of housing parts in the cooling tank without being limited to the case where the electronic devices of the single type are housed. In other words, a plurality of different kinds of electronic devices include one or more first electronic devices each configured to mainly execute arithmetic operations through a plurality of processors, and one or more second electronic devices each configured to mainly store data through a plurality of storage units. One or arbitrary number of the first electronic devices and one or arbitrary number of the second electronic devices are housed in the respective housing parts of the cooling apparatus separately so that the cooling system constitutes the computer with desired calculation capacity and desired storage capacity. Referring to the schematic view in FIG. 12, specifically, FIG. 12(a), 2 units of the electronic device 100 and 1 unit of the electronic device 300 may be housed in 3 of 16 housing parts of the liquid immersion cooling apparatus 1 to constitute the computer. Referring to FIG. 12(b), 6 units of the electronic device 100 and 3 units of the electronic device 300 may be housed in 9 housing parts to constitute the computer. The electronic device 100 corresponds to the first electronic device in which the arithmetic operation is mainly executed by the processors. The electronic device 300 corresponds to the second electronic device in which data storage is mainly executed by the storage units.

As described above, arbitrary combination of the first and the second electronic devices ensures to constitute the computer with desired calculation capacity and desired storage capacity. Therefore, it is possible to provide the configurable cooling system.

INDUSTRIAL APPLICABILITY

The present invention is widely applicable to electronic devices mounted with ultra-high density for liquid immersion cooling, and the liquid immersion cooling system configured to immerse the electronic devices in the coolant so as to be efficiently cooled.

REFERENCE SIGNS LIST

1: liquid immersion cooling apparatus,
2: cooling system,
10: cooling tank,
10a: open space,
10b: top plate,
11: bottom wall,
12: side wall,
12a: casing,
100, 300: electronic device,
110, 310: metal board,
111: suspension fitting hole 112: flow channel,
120, 320: substrate group
121, 321: first circuit board,
122, 322; second circuit board,
123, 323: third circuit board,
124, 324: processor,
125, 325: main memory
126a, 126b, 326a, 326b: socket,
128, 138: spacer,
129, 139: screw,
130: board retainer,
131: first connector,
132: second connector,
133: third connector,
134: slot,
135, 335: power unit,
136, 336: network cable socket,
137: bottom hole
140: support spacer,
13a, 13b, 13c, 13d, 13e: inner partition,
14a, 14b, 14c, 14d: housing part,
15: inlet,
150: bottom opening,
16: inflow header,
116: inflow opening,
160: inflow pipe,
17: outflow header,
117,127: outflow opening,
170: outflow pipe,
18: outlet,
20: lifting mechanism,
21: tower,
211: fixation base,
212: housing,
213: motive power source,
214: reducer,
215: gear,
216: timing pulley,
217: timing belt,
218: guide,
219: guide roller,
220: belt holder,
22: arm,
221: suspension fitting,
222: bracket,
223: bearing holder,
23: slide mechanism,
24: longitudinal rail (Y direction),
25: movable base,
251: guide roller,
26: lateral rail (X direction),
27: stopper,
28: support,
311: primary member,
312: secondary member,
313: cut,
314: pawl,
315, 316, 317: HDD support plate,
318, 319: SSD support plate,
340: backplane,
341: slit,
351: HDD,
352: SSD,
360: storage connector

The invention claimed is:

1. An electronic device that is immersed in a coolant filled in a cooling apparatus, and directly cooled, the electronic device being configured to be housed in each of a plurality of housing parts of the cooling apparatus, the electronic device comprising:
a metal board held with a pair of board retainers disposed in the housing part;
one or more substrate groups attached to a first surface of the metal board and a second surface opposite the first surface; and
a plurality of slots disposed above the one or more substrate groups, and arranged onto the metal board in parallel, each of which allows a power unit to be housed, wherein:
the substrate group includes a plurality of first circuit boards, each including a plurality of sockets for mounting a plurality of processors and a main memory on one surface of a substrate, and a component for interconnecting the processors, a second circuit board including a mother board component which includes at least a chipset for controlling the main memory, but does not include the sockets for mounting the processors and the main memory, and the component for interconnecting the processors, a third circuit board including a plurality of network controller chips and a plurality of network cable sockets corresponding to the respective first circuit boards, a first connector for electrically connecting between the first circuit boards and the second circuit board, a second connector for electrically connecting between the second circuit board and the third circuit board, and a flow channel formed in a gap between a surface opposite the one surface of the one or more first circuit boards, and one surface of the second circuit board, which faces the surface opposite the one surface of the one or more first circuit boards, and
the third circuit board is disposed so that the slots are interposed between the third circuit board and the metal board, and the network cable sockets are arranged in parallel on one side of the third circuit board, located at an opening side of the slots.

2. An electronic device that is immersed in a coolant filled in a cooling apparatus, and directly cooled, the electronic device being configured to be housed in each of a plurality of housing parts of the cooling apparatus, the cooling apparatus including a cooling tank with an open space defined by a bottom wall and side walls, a plurality of arranged housing parts formed by dividing the open space using a plurality of internal partition walls in the cooling tank, and an inflow opening and an outflow opening for the coolant, the inflow opening being formed in a bottom part or a side surface of each of the housing parts, and the outflow opening being formed around a surface of the coolant circulating in the respective housing parts, wherein:
the electronic device includes a metal board held with a pair of board retainers disposed in the housing part, one or more substrate groups attached to a first surface of the metal board and a second surface opposite the first surface, and a plurality of slots disposed above the one or more substrate groups, and arranged onto the metal board in parallel, each of which allows a power unit to be housed;
the substrate group includes a plurality of first circuit boards, each including a plurality of sockets for mounting a plurality of processors and a main memory on one surface of a substrate, and a component for interconnecting the processors, a second circuit board including a mother board component which includes at least a chipset for controlling the main memory, but does not include the sockets for mounting the processors and the main memory, and the component for interconnecting the processors, a third circuit board including a plurality of network controller chips and a plurality of network cable sockets corresponding to the respective first circuit boards, a first connector for electrically connecting between each of the first circuit boards and the second circuit board, a second connector for electrically connecting between the second circuit board and the third circuit board, and a flow channel formed in a gap between a surface opposite the one surface of the one or more first circuit boards, and one surface of the second circuit board, which faces the surface opposite the one surface of the one or more first circuit boards, and the third circuit board is disposed so that the slots are interposed between the third circuit board and the metal board, and the network cable sockets are arranged in parallel on one side of the third circuit board, located at an opening side of the slots.

3. The electronic device according to claim 1, further comprising a plurality of spacers for holding the gap, and a plurality of screws, wherein each of the screws pierces through the first circuit board, the second circuit board, and the respective spacers for fastening.

4. The electronic device according to claim 1, wherein an external shape of a connected body formed by attaching the one or more substrate groups respectively to the first and the second surfaces of the metal board is similar to an internal shape of each of the housing parts.

5. The electronic device according to claim 4, wherein the connected body has a rectangular parallelpiped external shape.

6. The electronic device according to claim 2, further comprising a plurality of spacers for holding the gap, and a plurality of screws, wherein each of the screws pierces through the first circuit board, the second circuit board, and the respective spacers for fastening.

7. The electronic device according to claim 2, wherein an external shape of a connected body formed by attaching the one or more substrate groups respectively to the first and the second surfaces of the metal board is similar to an internal shape of each of the housing parts.

8. The electronic device according to claim 7, wherein the connected body has a rectangular parallelpiped external shape.

* * * * *